(12) United States Patent
Sofue et al.

(10) Patent No.: US 6,566,750 B1
(45) Date of Patent: May 20, 2003

(54) SEMICONDUCTOR MODULE

(75) Inventors: Kenichi Sofue, Aichi (JP); Hiromitsu Yoshiyama, Aichi (JP); Toshinari Fukatsu, Aichi (JP); Toshiaki Nagase, Aichi (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/389,327

(22) Filed: Sep. 3, 1999

(30) Foreign Application Priority Data

Sep. 8, 1998 (JP) .......................................... 10-253612

(51) Int. Cl.[7] .............................................. H01L 23/34
(52) U.S. Cl. ..................................... 257/723; 257/724
(58) Field of Search .................................. 257/723, 724

(56) References Cited

U.S. PATENT DOCUMENTS 5,233,235 A * 8/1993 Ramacher .................. 257/701
5,822,191 A * 10/1998 Tagusa et al. ............... 257/724

FOREIGN PATENT DOCUMENTS

| EP | 0 588 094 A | 3/1994 | ........... H01L/23/64 |
| JP | 61-139051 | 6/1986 | ........... H01L/23/48 |
| JP | 10-84078 | 3/1998 | |

* cited by examiner

Primary Examiner—Amir Zarabian
Assistant Examiner—Kiesha Rose
(74) Attorney, Agent, or Firm—Morgan & Finnegan, LLP

(57) ABSTRACT

A plurality of semiconductor chips are provided on a base substrate. A drain region of the respective semiconductor chip is directly connected to the base substrate. A source electrode is formed in parallel with the arranging direction of the plurality of semiconductor chips. A source electrode and a source region of the respective semiconductor chip are connected using bonding wires. A plurality of source terminals are connected to the source electrode. A plurality of drain terminals are connected to the base substrate. The source terminal and drain terminal are located close to one another.

13 Claims, 4 Drawing Sheets

SEMICONDUCTOR MODULE

BACKGROUND OF THE INVENTION

1. Field of the Invention

The present invention relates to a semiconductor module, and in particular it relates to a non-insulated power semiconductor module.

2. Description of the Related Art

Lately, semiconductor modules are being widely used not only to process control signals, but also to control large electric currents. For example, a power semiconductor module with a large current capacity is used in a control device for driving the motor for running an electromotive vehicle, such as a battery-powered forklift, etc., as a switching device installed between a battery and the motor.

For such semiconductor modules, semiconductor modules with a variety of structures, such as, a semiconductor in which the current capacity is enlarged by connecting power semiconductor chips of the same kind in parallel, a semiconductor module which is constituted as a simple circuit with several kinds of semiconductor chips, a semiconductor module which has an embedded driving circuit composed of semiconductor chips, etc., are known.

A semiconductor module, in particular a power semiconductor module, is usually formed by building one of the semiconductor chips described above in a resin package. The package is usually made of plastics, and the semiconductor chip is insulated using ceramics, etc. The space inside the package is filled up with gel, epoxy resin, etc.

A power semiconductor module generates a large amount of heat, since a large current flows through the module. Therefore, measures must be taken to radiate the heat. A method for installing a semiconductor module on a base substrate which has both a large heat capacity and a high heat radiation effect is often used to radiate the heat of semiconductor modules. In this case, the heat generated by a semiconductor module is radiated through the base substrate.

FIG. 1A shows the internal structure of a conventional semiconductor module. A MOSFET is used as an example here.

A semiconductor module 100 includes a plurality of semiconductor chips 101 which are connected to each other in parallel (three semiconductor modules 101a, 101b and 101c in FIG. 1A). A plurality of semiconductor chips 101 are arranged in a straight line with the respective drain region connected to the conductive base substrate 102. Semiconductors with such a structure are often termed "non-insulated".

A source electrode 103 and a gate electrode 104 are formed in parallel with the arranging direction of the plurality of semiconductor chips 101. The source electrode 103 and gate electrode 104 are connected to a source region and a gate region, respectively, of each semiconductor chip 101 using bonding wires 105. The source electrode 103 and gate electrode 104 are electrically insulated from the base substrate 102 using an insulation sheet 106.

A drain terminal 107, a source terminal 108 and a gate terminal 109 are connected to the base substrate 102, source electrode 103 and gate electrode 104, respectively. The drain terminal 107 and source terminal 108 are an input point and an output point of the main current of this semiconductor module, respectively.

Each of the semiconductor chips 101 are turned on, when a control voltage is applied between the gate and source. In this case, the main current which is supplied through the drain terminal 103 reaches the source terminal 108 through the base substrate 102, each of the semiconductor chips 101, bonding wires 105 and source electrode 103 in this order. Here, the base substrate 102 functions as a drain electrode.

However, as shown in FIG. 1A, in a conventional semiconductor module 100, only one drain terminal 107 and only one source terminal 108 are usually provided in either end of the module. For this reason, as shown in FIG. 1B, the lengths of the path through which the main current flows are different depending on the position of the respective semiconductor chip 101. In the example shown in FIG. 1B, a path Ic through the semiconductor chip 101c is substantially longer than a path Ia through the semiconductor chip 101a. Here, inductance in a current path is nearly proportional to the length of the path. Thus, in this example, the inductance of the path Ic becomes larger than the inductance of the path Ia.

The influence of this inductance occurs at the time the semiconductor chip 101 is switched (especially, at the time the MOSFET is turned off). Specifically, the larger the inductance is, the larger the surge voltage that is generated at the time the semiconductor chip 101 is turned off is. Sometimes the semiconductor chip 101 is damaged since this surge voltage is applied to the semiconductor chip 101.

In a case that the length of a current path is different in each semiconductor chip, all the semiconductor chips do not operate in the same way even if the characteristics of all the semiconductor chips are the same. As a result, some of the particular semiconductor chips are easily damaged.

SUMMARY OF THE INVENTION

An object of the present invention is to suppress the surge voltage of a semiconductor module including a plurality of semiconductor elements.

In a semiconductor module of the present invention, a plurality of semiconductor chips are arranged in a straight line on a conductive substrate which functions as an electrode for inputting the main current. This semiconductor module comprises a terminal for inputting the main current, which is connected to the conductive substrate and is formed in parallel with the arranging direction of the plurality of semiconductor chips, and a terminal which is connected to the respective region for outputting the main current of the plurality of semiconductor chips and is formed in parallel with the arranging direction of the plurality of semiconductor chips. The end portion of at least one of the terminal for inputting the main current and terminal for outputting the main current is divided in parallel in the flowing direction of the main current.

If the terminal for inputting the main current is divided into two or more parts, the main current supplied to the respective semiconductor chip is to be inputted through the nearest divided part. If the terminal for outputting the main current is divided into two or more parts, the main current which flows through the respective semiconductor chip is to be outputted to the nearest divided part. In addition, the terminal for inputting the main current and terminal for outputting the main current are formed in parallel with the arranging direction of the plurality of semiconductor chips, respectively. Therefore, the main current of the respective semiconductor chip flows through the shortest path, and the lengths of all the paths are almost the same each other. As a result, the wiring inductances of all the semiconductor chips become uniform and small, and thus the surge voltages which are applied to the semiconductor chips also become uniform and small.

BRIEF DESCRIPTION OF THE DRAWINGS

FIG. 2A is the oblique section view, and FIG. 2B is the top view.

DESCRIPTION OF THE PREFERRED EMBODIMENTS

Figure 2A:
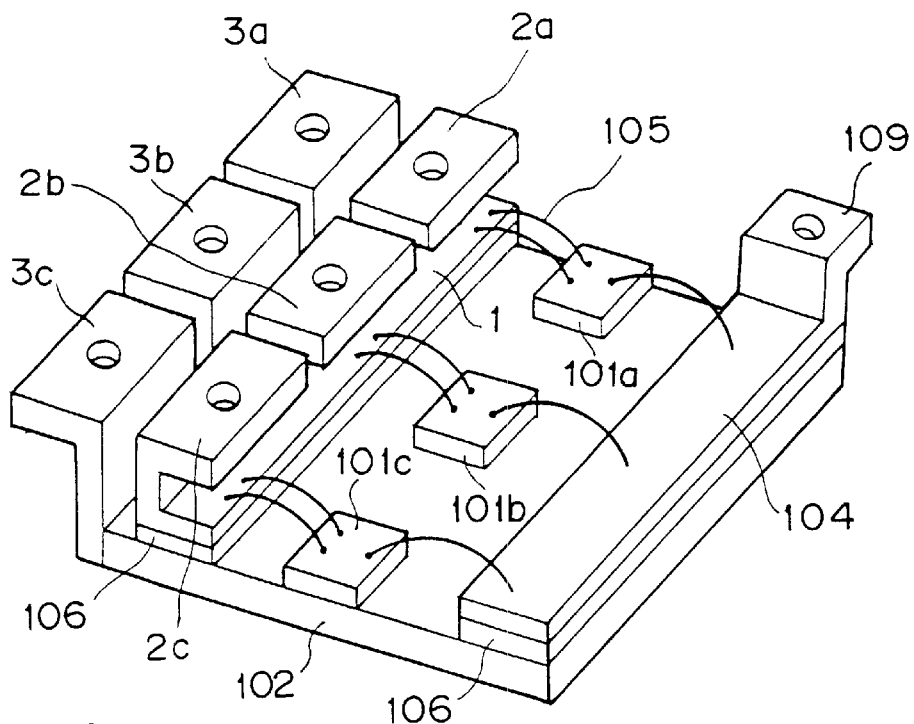
FIGS. 2A and 2B show the internal structure of a semiconductor module, which is one preferred embodiment of the present invention.
Figure 2B:
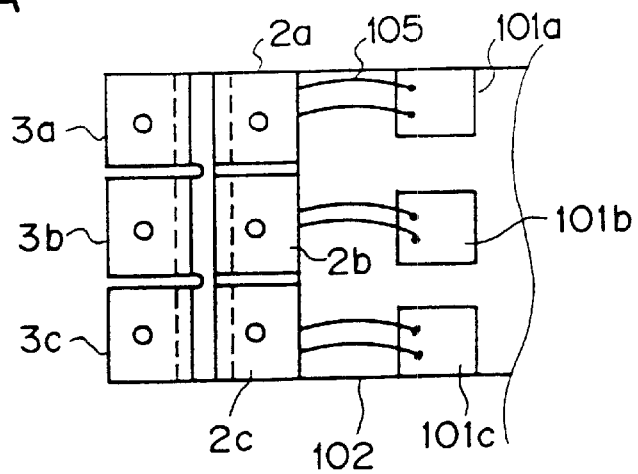

FIGS. 2A and 2B show the internal structure of a semiconductor module, which is one preferred embodiment of the present invention. FIG. 2A is the oblique section view, and FIG. 2B is the top view.

Figure 1A:
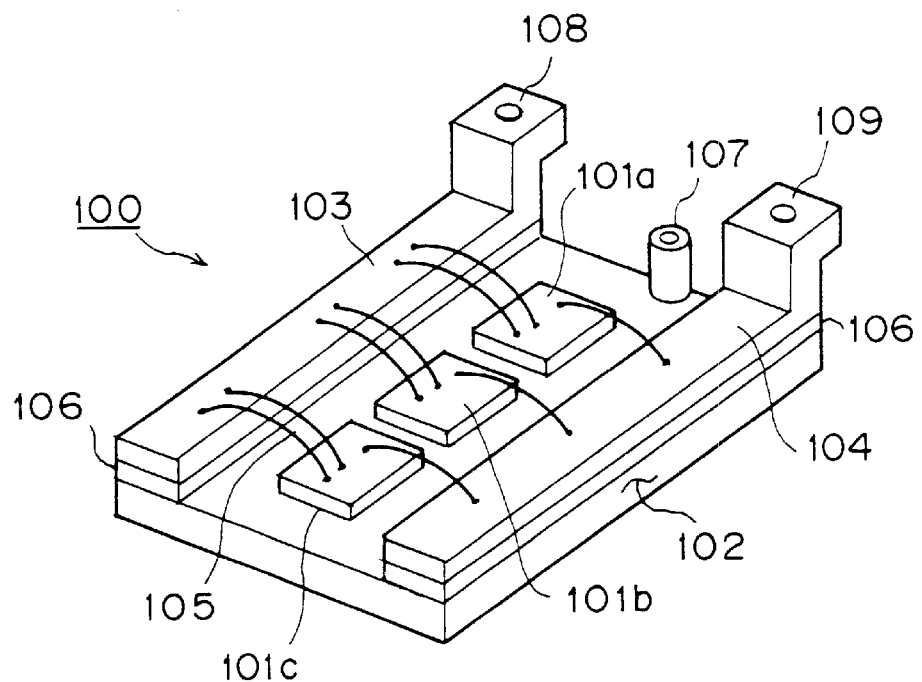
FIG. 1A shows the internal structure of a conventional semiconductor module.

The reference numbers in FIG. 2 are the same as those in FIG. 1A indicate the same components. Namely, a plurality of semiconductor chips 101 (101a through 101c), base substrate 102, gate electrode 104, bonding wire 105, insulation sheet 106 and gate terminal 109 are basically the same as the components used for the conventional semiconductor module shown in FIG. 1A.

The semiconductor module in this preferred embodiment is characterized mainly in the structure and arrangement of a source electrode, source terminal and drain terminal.

A source electrode 1 is formed in parallel with the arranging direction of the plurality of semiconductor chips 101, and is connected to the source region of the respective semiconductor chip 101 using bonding wires 105. The source electrode 1 is electrically insulated from the base substrate 102 using the insulation sheet 106.

Source terminals 2a, 2b and 2c are directly connected to the source electrode 1. A hole formed in each of the source terminals 2a through 2c is used for connection to an external circuit (including a power supply circuit), etc. Specifically, each of the source terminals 2a through 2c is the output point of the main current in the semiconductor module. The widths of all the source terminals 2a through 2c (lengths in the arranging direction of the plurality of semiconductor chips 101) are the same, and are formed in such a way that the width becomes as large as possible. The source electrode 1 and source terminals 2a through 2c can be formed monolithically.

Drain terminals 3a, 3b and 3c are directly connected to the base substrate 102. A hole formed in each of the drain terminals 3a through 3c is used for connection to an external circuit (including a power supply circuit), etc. Specifically, each of the drain terminals 3a through 3c is the input point of the main current in the semiconductor module. As with the source terminals 2a through 2c, the widths of all the drain terminals 3a through 3c are the same, and are formed in such a way that the width is as large as possible.

In the semiconductor module 100 with the above structure, each of the semiconductor chips 101 is turned on, if a control voltage is applied between the gate and source. In this case, the main current which is supplied through the drain terminals 3a, 3b and 3c reaches the source terminals 2a, 2b and 2c, through the base substrate 102, respective semiconductor chip 101, bonding wires 105 and source electrode 1 in this order.

Figure 3A:
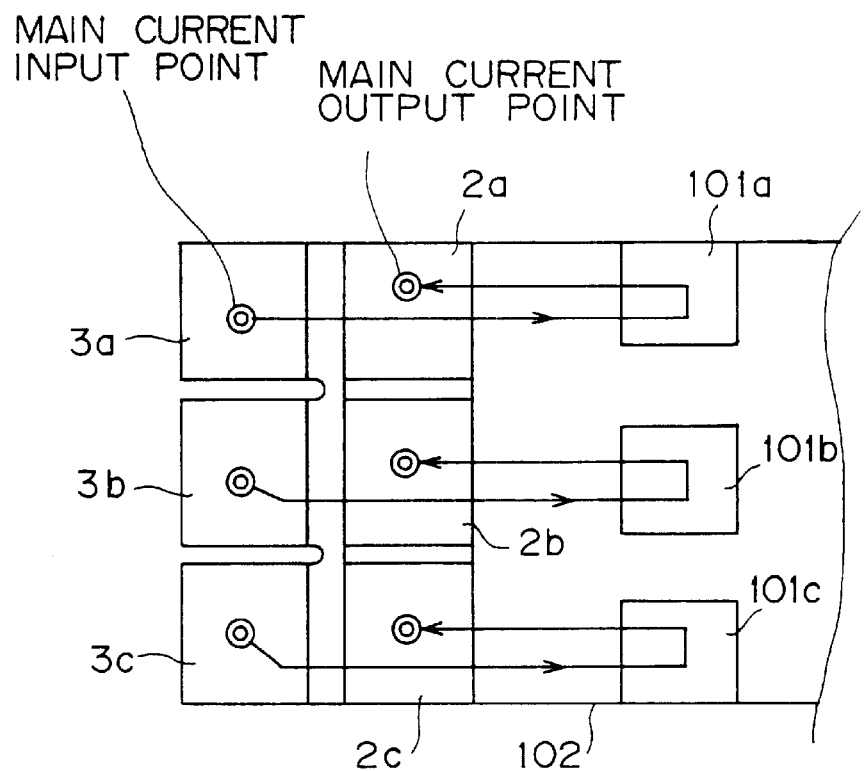
FIGS. 3A and 3B explain the path of the main current in this preferred embodiment.
Figure 3B:
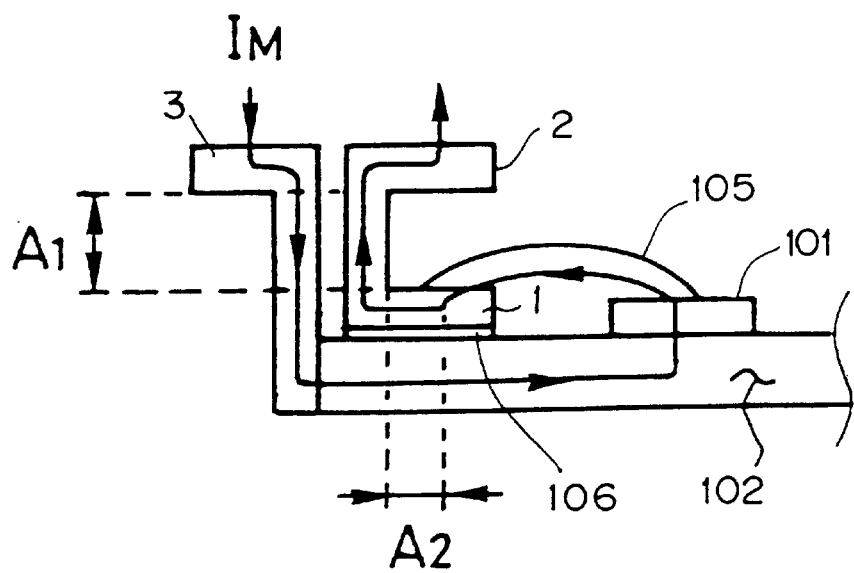

FIGS. 3A and 3B explain the path of the main current in this preferred embodiment. In FIG. 3B, a "source terminal 2" indicates an arbitrary source terminal of the source terminals 2a through 2c, and a "drain terminal 3" indicates an arbitrary drain terminal of the drain terminals 3a through 3c.

As shown in FIG. 3A, the semiconductor module in this preferred embodiment comprises a plurality of drain terminals 3a through 3c and a plurality of source terminals 2a through 2c. Thus, the semiconductor module in this preferred embodiment has a plurality of main current input points (main current supply points) and a plurality of main current output points.

In this structure, the main currents of a plurality of semiconductor chips 101a through 101c are supplied from a plurality of main current input points and are outputted to a plurality of main current output points. Here, the main current of the respective semiconductor chip 101a through 101c takes the shortest path of a plurality of paths from a main current input point to a main current output point.

For example, the main current of the semiconductor chip 101a is supplied from the drain terminal 3a and is outputted to the source terminal 2a. The main current of the semiconductor chip 101b is supplied from the drain terminal 3b and is outputted to the source terminal 2b.

As a result, the lengths of all the paths of the main current of the semiconductor chips 101a through 101c from the input terminal to the output terminal of the semiconductor module become almost the same. Thus, the wiring inductances of all the semiconductor chips also become almost the same.

If the wiring inductances of all the semiconductor chips are the same, all the surge voltages generated at the switching operation (especially at the time the MOSFET is turned off) become almost the same. As a result, the problem in which a particular semiconductor chip is easily damaged can be avoided.

Figure 1B:
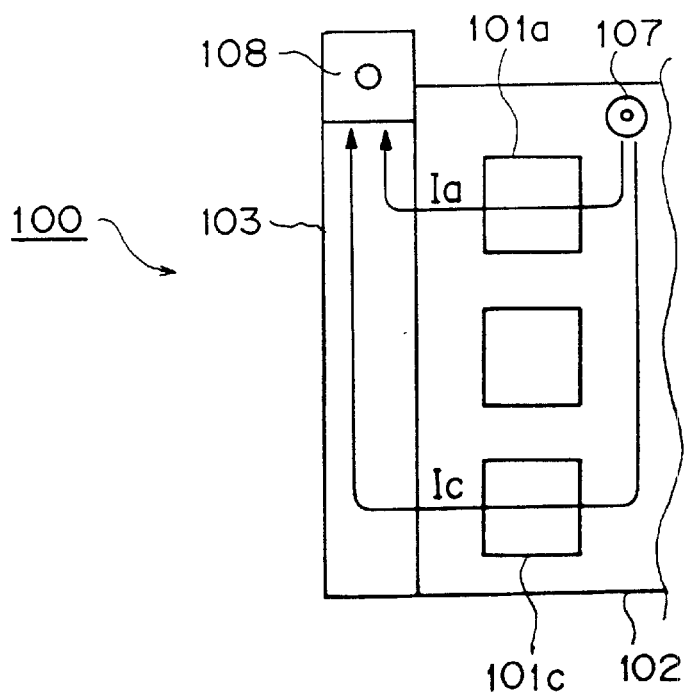
FIG. 1B explains the path of the main current in the semiconductor module shown in FIG. 1A.

In a conventional semiconductor module, as shown in FIG. 1B, the paths of some semiconductor chips become long, and the inductances of the paths become large. However, in the semiconductor of the preferred embodiment, as shown in FIG. 3A, all the paths of the main current of semiconductor chips 101a through 101c have the shortest length. Therefore, the inductance of the respective semiconductor chip becomes small, and the surge voltage applied to the respective semiconductor chip becomes small. As a result, the semiconductor module in this preferred embodiment can be used in a higher input voltage range even if the conventional semiconductor chips are used.

As shown in FIG. 3B, according to the semiconductor module in this preferred embodiment, the source terminal 2 and drain terminal 3 are closely formed. The source terminal 2 and drain terminal 3 are insulated, for example, using a case to protect semiconductor chips 101a through 101c. In this case, the thickness of the case shall be sufficiently thin such that the source terminal 2 and the drain terminal 3 are close to each other. This case is formed of a material which allows magnetic flux to pass.

The directions of the main current flowing through the source terminal 2 and drain terminal 3 are opposite to each other. For this reason, in a region A1, a magnetic field generated by the main current flowing through the source terminal 2 and a magnetic field generated by the main current flowing through the drain terminal 3 are offset by each other, and thus the inductance of this path becomes reasonably small. In the same way, in a region A2, a magnetic field generated by the main current flowing through the source electrode 1 and a magnetic field generated by main current flowing through the base substrate 102 are offset by each other, and thus the inductance of this path also becomes reasonably small.

If the wiring inductance of the respective semiconductor chip becomes small, the surge voltage generated at the switching operation of the semiconductor chips (especially at the time the MOSFET is turned off) becomes small. As a result, the semiconductor module in this preferred embodiment can be used in a higher input voltage range even if the conventional semiconductor chips are used.

The source electrode 1 and the source terminals 2a through 2c can be monolithically formed from a piece of a metal plate. In this case, the source terminals 2a through 2c are formed by bending. The bending is easy and a distortion is small because the portions to be bent (the source terminals 2a through 2c) are divided each other.

Although in the above preferred embodiment, one set of a source terminal and drain terminal are formed for each of the semiconductor chips, the present invention is not limited to this structure. For example, one source terminal and one drain terminal can be formed for a plurality of semiconductor chips.

Figure 4:
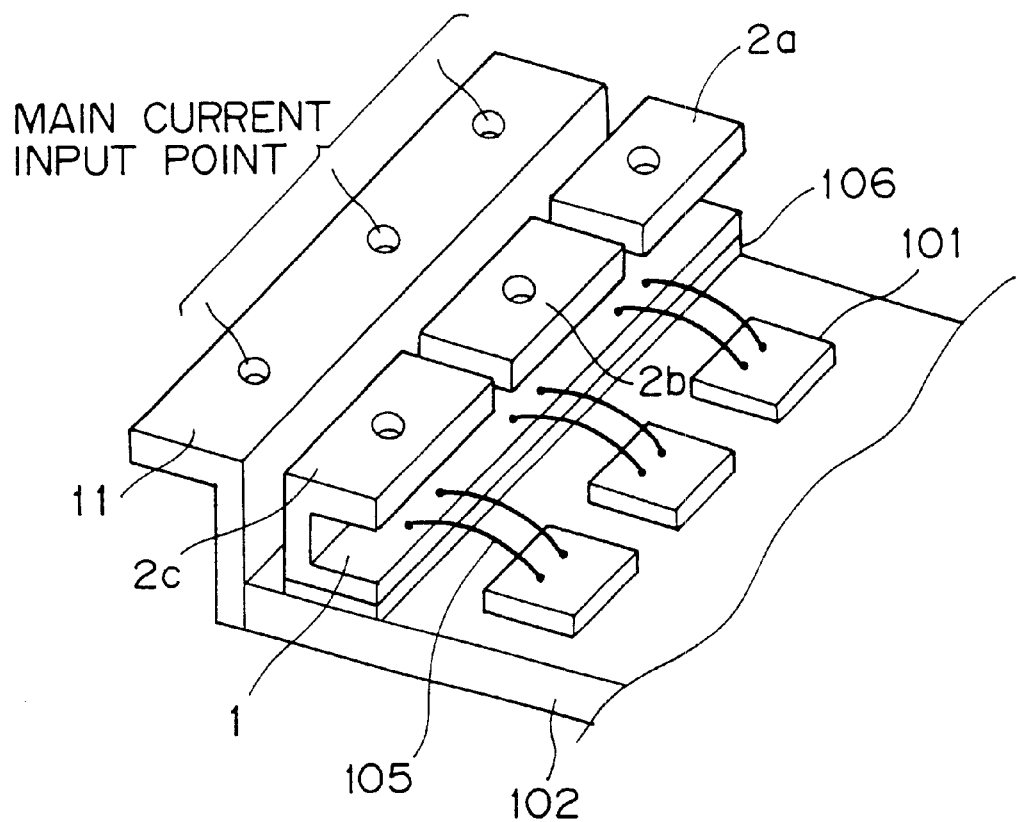
FIG. 4 shows the internal structure of a semiconductor module of another preferred embodiment of the present invention.

Although in the above preferred embodiment, a source terminal and drain terminal both are divided into two or more parts, the present invention is not limited to this structure. For example, as shown in FIG. 4, a structure in which a drain terminal is not divided is acceptable. However, in this case too, it is desirable for a plurality of main current input points to be formed in the drain terminal. In the same way, a structure in which the source terminal is not divided is acceptable. However, in this case too, it is desirable for a plurality of main current output points to be formed in the source terminal.

In addition, according to the semiconductor module in this preferred embodiment, a source electrode can be divided into two or more parts. In this case, each divided source electrode is connected to one or more source regions of semiconductor chips through bonding wires.

Furthermore, although in the above preferred embodiment, a semiconductor is assumed to be a MOSFET, the structure of the present invention can be selected irrespective of the kind of semiconductor device. For example, IGBT, GTO, bipolar transistor, thyristor, etc., can be used.

As described above, according to the present invention, since the lengths of the paths of the main current of all semiconductor devices become uniform and short, the wiring inductance of all the semiconductor devices become uniform and small, and thus all the surge voltages become small. As a result, the upper limit of an input voltage which can be applied to a semiconductor module is extended. If the surge voltage becomes small, a protection circuit, such as a snubber circuit, etc., is not required or the scale of such a protection circuit can be reduced. Accordingly, a semiconductor module itself can be miniaturized.

What is claimed is:

1. A semiconductor module in which a plurality of semiconductor chips are arranged in a straight line on a conductive substrate which functions as an electrode for inputting main current, the module comprising:

a plurality of main current input terminals for inputting a main current to the module, each of the input terminals being provided for the respective one of the plurality of semiconductor chips, and being connected to the conductive substrate and formed in parallel with an arranging direction of the plurality of semiconductor chips; and a plurality of main current output terminals for outputting the main current from the module, each of the output terminals being provided for the respective one of the plurality of semiconductor chips, and being connected to each of a plurality of main current output regions of the plurality of the semiconductor chips and formed in parallel with the arranging direction of the plurality of the semiconductor chips, wherein the input and output terminals are disposed on the same side of the respective semiconductor chip and arranged in a colinear manner each of the terminals couple the respective semiconductor chips with an external circuit located outside the module, whereby a plurality of main current paths, in each of which the respective semiconductor chip is located, are formed between the respective input and output terminals within the module, the paths each having substantially the same length.

2. The semiconductor module according to claim 1, wherein lengths of said main current input terminal and said main current output terminal are the same as a overall length of a configuration of the plurality of semiconductor chips arranged on the conductive substrate.

3. The semiconductor module according to claim 1, wherein if the end portion of said main current input terminal is divided, each divided part is connected to a respective external circuit.

4. The semiconductor module according to claim 1, wherein if the end portion of said main current output terminal is divided, each divided part is connected to a respective external circuit.

5. The semiconductor module according to claim 1, wherein said main current input terminal and said main current output are located close to one another.

6. A semiconductor module including a plurality of semiconductor chips, the module comprising:

a first electrode with a plurality of main current input terminals for inputting a main current to the module, each of the input terminals being provided for the respective one of the plurality of semiconductor chips wherein, the first electrode is connected to a main current input region for each of the plurality of semiconductor chips; and a second electrode with a plurality of main current output terminals for outputting a main current from the module, each of the output terminals being provided for the respective one of the plurality of semiconductor chips wherein, the second electrode is connected to a main current output region for each of the plurality of semiconductor chips, wherein the first and second electrodes are disposed on the same side of the semiconductor chip and arranged in a colinear manner and are connected to the plurality of semiconductor chips and an external circuit located outside the module, through a plurality of connection points, a plurality of main current paths, in each of which the respective semiconductor chip is located, are formed between the respective first and second electrodes within the module, the main current paths each having substantially the same length.

7. The semiconductor module according to claim 6, wherein said first electrode is a conductive substrate on which the plurality of semiconductor chips are arranged and said second electrode is formed in parallel with an arranging direction of the plurality of semiconductor chips.

8. The semiconductor module according to claim 7, further comprising
   a first terminal connected to said first electrode, wherein said first terminal is formed in parallel with the arranging direction of the plurality of semiconductor chips, with the length of said first terminal being the same as length of overall configuration of the plurality of semiconductor chips, and said first electrode is connected to the external circuit through said first terminal.

9. The semiconductor module according to claim 8, wherein an end portion of said first terminal is divided into two or more parts, and each divided part is connected to the respective external circuit.

10. The semiconductor module according to claim 7, further comprising
    a plurality of first terminals connected to said first electrode, wherein
       said first electrode is connected to the external circuit through the plurality of first terminals.

11. The semiconductor module according to claim 7, wherein the length of said second electrode is the same as the length of overall configuration of the plurality of semiconductor chips, and said second electrode is connected to the external circuit through a plurality of connection points.

12. The semiconductor module according to claim 11, wherein a plurality of terminals are formed in an end portion of said second electrode, and each terminal is connected to the respective external circuit.

13. The semiconductor module according to claim 11, further comprising
    a plurality of second terminals connected to said second electrode, wherein
       said second electrode is connected to the external circuit through the plurality of second terminals.

* * * * *

UNITED STATES PATENT AND TRADEMARK OFFICE
CERTIFICATE OF CORRECTION

PATENT NO. : 6,566,750 B1
DATED : May 20, 2003
INVENTOR(S) : Kenichi Sofue et al.

It is certified that error appears in the above-identified patent and that said Letters Patent is hereby corrected as shown below:

<u>Column 4,</u>
Line 22, please delete the hard return after "point." so that "For example,…" does not begin as a new paragraph but follows as a new sentence in the same paragraph.

Signed and Sealed this

Ninth Day of September, 2003

JAMES E. ROGAN
*Director of the United States Patent and Trademark Office*